(12) United States Patent
Cao et al.

(10) Patent No.: US 12,402,518 B2
(45) Date of Patent: Aug. 26, 2025

(54) DISPLAY PANEL WITH REDUCED GAS BREAKING AND FOREIGN MATTER INVASION AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Siwei Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,843

(22) PCT Filed: Dec. 21, 2021

(86) PCT No.: PCT/CN2021/140089
§ 371 (c)(1),
(2) Date: Dec. 26, 2021

(87) PCT Pub. No.: WO2023/108719
PCT Pub. Date: Jun. 22, 2023

(65) Prior Publication Data
US 2024/0040906 A1 Feb. 1, 2024

(30) Foreign Application Priority Data
Dec. 15, 2021 (CN) .......................... 202111535128.4

(51) Int. Cl.
*H10K 59/80* (2023.01)
*H10K 59/12* (2023.01)

(52) U.S. Cl.
CPC ....... *H10K 59/874* (2023.02); *H10K 59/1201* (2023.02)

(58) Field of Classification Search
CPC ............. H10K 59/874; H10K 59/1201; H10K 59/873; H10K 2102/331
(Continued)

(56) References Cited

U.S. PATENT DOCUMENTS 6,740,145 B2 * 5/2004 Boroson ............... F26B 21/083
257/E23.137
2006/0284556 A1 * 12/2006 Tremel ................. H10K 59/874
313/506
(Continued)

FOREIGN PATENT DOCUMENTS

| CN | 1894790 | * | 6/2011 |
| CN | 104241320 A | | 12/2014 |

(Continued)

OTHER PUBLICATIONS

International Search Report in International application No. PCT/CN2021/140089, mailed on Aug. 25, 2022.
(Continued)

*Primary Examiner* — Duy T Nguyen
(74) *Attorney, Agent, or Firm* — PV IP PC; Wei Te Chung

(57) ABSTRACT

A display panel and a manufacturing method thereof are provided. A light-emitting device layer is disposed on a substrate, and an encapsulation layer covers the light-emitting device layer and the substrate. The encapsulation layer includes a first inorganic layer, a getter layer, an organic layer, and a second inorganic layer, and the first inorganic
(Continued)

layer covers the light-emitting device layer, wherein the getter layer is disposed on the first inorganic layer, the organic layer is disposed on the getter layer, the second inorganic layer covers the organic layer and the getter layer and is connected to the first inorganic layer.

15 Claims, 2 Drawing Sheets

(58) Field of Classification Search
USPC .......................................................... 257/91
See application file for complete search history.

(56) References Cited

U.S. PATENT DOCUMENTS

| | | | | |
|---|---|---|---|---|
| 2007/0013305 A1* | 1/2007 | Wang | ........................ | C03C 8/02 |
| | | | | 313/553 |
| 2008/0042547 A1* | 2/2008 | Chien | ........................ | H01J 7/18 |
| | | | | 313/311 |
| 2010/0136239 A1* | 6/2010 | Wang | ................ | B01J 20/28033 |
| | | | | 252/181.7 |
| 2014/0368107 A1* | 12/2014 | Jung | .................... | H10K 50/846 |
| | | | | 313/504 |
| 2016/0088756 A1 | 3/2016 | Ramadas | | |
| 2017/0027168 A1 | 2/2017 | Heath | | |

FOREIGN PATENT DOCUMENTS

| | | | |
|---|---|---|---|
| CN | 104704035 | A | 6/2015 |
| CN | 106653517 | A | 5/2017 |
| CN | 106848092 | A | 6/2017 |
| CN | 107492601 | A | 12/2017 |
| CN | 109046248 | A | 12/2018 |
| CN | 109904345 | A | 6/2019 |
| CN | 109994524 | * | 7/2019 |
| CN | 110459694 | A | 11/2019 |
| CN | 111129349 | A | 5/2020 |
| CN | 214226948 | U | 9/2021 |
| KR | 20120133279 | A | 12/2012 |

OTHER PUBLICATIONS

Written Opinion of the International Search Authority in International application No. PCT/CN2021/140089,mailed on Aug. 25, 2022.

Chinese Office Action issued in corresponding Chinese Patent Application No. 202111535128.4 dated Apr. 29, 2023, pp. 1-10.

* cited by examiner

DISPLAY PANEL WITH REDUCED GAS BREAKING AND FOREIGN MATTER INVASION AND MANUFACTURING METHOD THEREOF

FIELD OF INVENTION

This application relates to a field of display technology and particularly relates to a display panel and a manufacturing method thereof.

BACKGROUND OF INVENTION

In a process of research and practice of prior art, the inventor of this application found that common undesirable black spots in current mass-produced organic light-emitting diode panels seriously affect product quality. Through analyzing many cases where an inorganic encapsulation layer is broken due to foreign matter, it is found that the main reason is that gas released by an organic encapsulation layer and external water vapor invaded from cracks of a film layer, thus damaging a cathode and organic light-emitting diode (OLED) materials, and forming dot-like luminescence abnormalities.

Technical Problem

Embodiments of the present application provide a display panel and a manufacturing method thereof, which can absorb the gas released by the organic layer in the encapsulation layer and reduce the risk of occurrence of undesirable black spots.

SUMMARY OF INVENTION

An embodiment of the present application provides a display panel, which includes: a substrate; a light-emitting device layer disposed on the substrate; and at least one encapsulation layer, wherein the encapsulation layer includes: a first inorganic layer covering the light-emitting device layer; a getter layer disposed on the first inorganic layer; an organic layer disposed on the gettering layer; and a second inorganic layer covering the organic layer and the getter layer and connected to the first inorganic layer; wherein a material of the getter layer includes getter graphene, the getter graphene is formed of graphene-based carbon material and getter nanoparticle through chemical groups bonding, and the graphene-based carbon materials are bonded to each other through the chemical groups.

Optionally, in some embodiments of the present application, the graphene-based carbon material includes at least one graphene or carbon nanotube.

Optionally, in some embodiments of the present application, the getter layer further includes a resin and a photo initiator.

Optionally, in some embodiments of the present application, the getter nanoparticle has a porous structure.

Optionally, in some embodiments of the present application, the first inorganic layer includes a first boundary, the getter layer includes a second boundary, the organic layer includes a third boundary, and the second inorganic layer includes a fourth boundary, wherein the third boundary is defined on an inner side of the second boundary, and the second boundary is defined on an inner side of the first boundary; and wherein the second inorganic layer is respectively connected to the second boundary and the third boundary, and the fourth boundary is located outside the first boundary or coincides with the first boundary.

Optionally, in some embodiments of the present application, a distance from the first boundary to the second boundary is greater than a distance from the second boundary to the third boundary.

Optionally, in some embodiments of the present application, a groove is defined on a side of the gettering layer facing the organic layer, and the organic layer fills the groove.

Optionally, in some embodiments of the present application, the getter nanoparticles are molecular sieves or nano metal organic framework molecules.

An embodiment of the present application further provides a display panel, which includes: a substrate; a light-emitting device layer disposed on the substrate; and at least one encapsulation layer, wherein the encapsulation layer includes: a first inorganic layer covering the light-emitting device layer; a getter layer disposed on the first inorganic layer; an organic layer disposed on the gettering layer; and a second inorganic layer covering the organic layer and the getter layer and connected to the first inorganic layer.

Optionally, in some embodiments of the present application, a material of the getter layer comprises getter graphene, the getter graphene is formed of graphene-based carbon material and getter nanoparticle through chemical groups bonding.

Optionally, in some embodiments of the present application, the graphene-based carbon materials are bonded to each other through the chemical groups.

Optionally, in some embodiments of the present application, a groove is defined on a side of the gettering layer facing the organic layer, and the organic layer fills the groove.

Optionally, in some embodiments of the present application, the graphene-based carbon material includes at least one graphene or carbon nanotube.

Optionally, in some embodiments of the present application, the getter layer further includes a resin and a photo initiator.

Optionally, in some embodiments of the present application, each getter nanoparticle has a porous structure.

Optionally, in some embodiments of the present application, the first inorganic layer includes a first boundary, the getter layer includes a second boundary, the organic layer includes a third boundary, and the second inorganic layer includes a fourth boundary, wherein the third boundary is defined on an inner side of the second boundary, and the second boundary is defined on an inner side of the first boundary; and wherein the second inorganic layer is respectively connected to the second boundary and the third boundary, and the fourth boundary is located outside the first boundary or coincides with the first boundary.

Optionally, in some embodiments of the present application, a distance from the first boundary to the second boundary is greater than a distance from the second boundary to the third boundary.

Correspondingly, this application further relates to a manufacturing method of a display panel, which includes the following steps: forming a light-emitting device layer on a substrate; forming at least one encapsulation layer on the light-emitting device layer; wherein the step of forming the at least one encapsulation layer on the light-emitting device layer includes the following steps: forming a first inorganic layer on the light-emitting device layer; forming a getter layer on the first inorganic layer; forming an organic layer on the gettering layer; and forming a second inorganic layer on the organic layer, wherein the second inorganic layer covers the organic layer and the getter layer and is connected to the first inorganic layer.

Optionally, in some embodiments of the present application, the step of forming the getter layer on the first inorganic layer includes the following steps: bonding graphene-based carbon materials and getter nanoparticles through chemical groups to form getter graphene; mixing the getter graphene, resin, and photo initiator to form a mixed material; applying the mixed material to the first inorganic layer to form a mixed material layer; and curing the mixed material layer to form the gettering layer.

Optionally, in some embodiments of the present application, the graphene-based carbon material includes at least one graphene or carbon nanotube.

In the display panel in the embodiment of the present application, the light-emitting device layer is disposed on the substrate, the encapsulation layer covers the light-emitting device layer and the substrate. The encapsulation layer includes a first inorganic layer, a getter layer, an organic layer, and a second inorganic layer. The first inorganic layer covers the light-emitting device layer. The getter layer is disposed on the first inorganic layer. The organic layer is arranged on the getter layer. The second inorganic layer covers the organic layer and the getter layer and is connected to the first inorganic layer.

BENEFICIAL EFFECT

In the display panel and the manufacturing method thereof in the embodiments of the present application, a getter layer is formed in the encapsulation layer to absorb the gas released by the organic layer, thereby reducing the amount of gas in the encapsulation layer. This reduces the risk of gas breaking the inorganic layer, and prevents the first inorganic layer from being damaged by foreign matter and causing external water and oxygen to invade the light-emitting device layer.

DESCRIPTION OF DRAWINGS

In order to describe the technical solutions in the embodiments of the present application more clearly, the following will briefly introduce the drawings that need to be used in the description of the embodiments. Obviously, the drawings in the following description are only some embodiments of the application. For those skilled in the art, other drawings can be obtained based on these drawings without doing creative work.

DETAILED DESCRIPTION OF PREFERRED EMBODIMENTS

Figure 1:
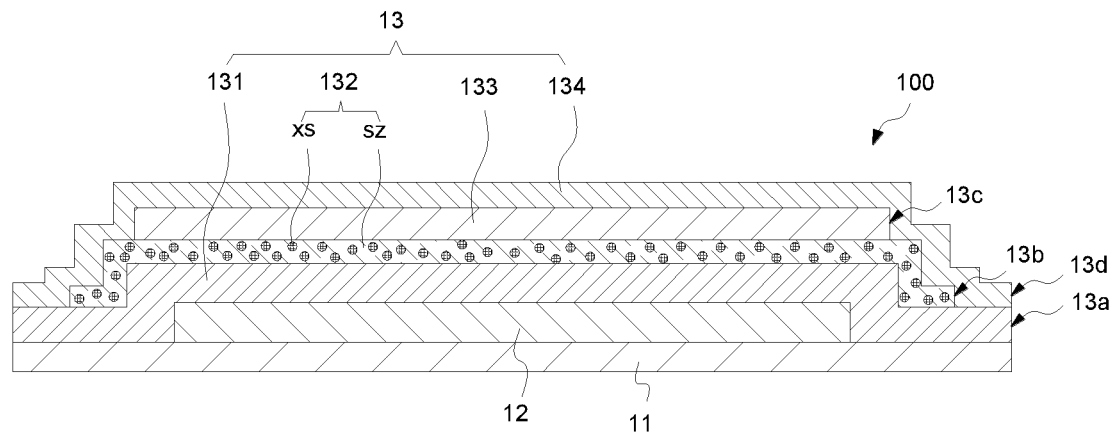
FIG. 1 is a schematic structural diagram of a display panel provided by an embodiment of the present application.

The following will describe the technical solutions in the embodiments of the present application clearly and completely with reference to the drawings in the embodiments of the present application. Obviously, the embodiments are only a part of the embodiments of the present application, rather than all the embodiments. Based on these embodiments in this application, all other embodiments obtained by those skilled in the art without doing creative work shall fall within the protection scope of this application. In addition, the specific implementations described herein are only used to illustrate and explain the present application, and are not used to limit the present application. In this application, if no explanation is made to the contrary, the orientation terms such as "upper" and "lower" usually refer to the upper and lower positions of the device in actual use or working state. Specifically, it is the direction in the drawings, and "inner" and "outer" refer to the outline of the device.

The embodiment of the present application provides a display panel and a manufacturing method thereof, which will be described in detail below. It should be noted that the order of description in the following embodiments is not meant to limit the preferred order of the embodiments.

Please refer to FIG. 1, an embodiment of the present application provides a display panel 100, which includes a substrate 11, a light-emitting device layer 12, and at least one encapsulation layer 13.

The light-emitting device layer 12 is disposed on the substrate 11. The encapsulation layer 13 covers the light-emitting device layer 12 and the substrate 11.

The encapsulation layer 13 includes a first inorganic layer 131, a getter layer 132, an organic layer 133, and a second inorganic layer 134. The first inorganic layer 131 covers the light-emitting device layer 12. The getter layer 132 is disposed on the first inorganic layer 131. The organic layer 133 is disposed on the getter layer 132. The second inorganic layer 134 covers the organic layer 133 and the getter layer 132 and is connected to the first inorganic layer 131.

In the display panel 100 in the embodiment of the present application, a getter layer 132 is formed in the encapsulation layer 13 to absorb the gas released by the organic layer 133, which reduces the amount of gas in the encapsulation layer 13, and reduces the risk of gas breaking the inorganic layer. In addition, this prevents external water and oxygen from invading the light-emitting device layer when the first inorganic layer is damaged by foreign matter, thereby reducing the formation of black spots.

Optionally, substrate 11 includes a base and a thin film transistor disposed on the base. The substrate can be a rigid substrate or a flexible substrate. The material of the substrate includes any one of glass, sapphire, silicon, silicon dioxide, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, polyimide, or polyurethane.

Optionally, the light-emitting device layer 12 includes a first electrode, a light-emitting layer, and a second electrode that are sequentially disposed on the substrate 11. The light-emitting device layer 12 may be a top emission type or a bottom emission type.

That is, one of the first electrode and the second electrode is a reflective electrode, and the other is a transparent electrode.

Optionally, the material of the light-emitting layer may be an organic material. For example, it can be Alq3, bis (2-methyl-8-hydroxyquinoline-N1,O8)-(1,1'-biphenyl-4-hydroxy) aluminum (BAlq), DPVBi, Almq3, 3-tert-butyl-9, 10-bis (2-naphthalene) anthracene (TBADN).

The material of the light-emitting layer can also be an inorganic material. For example, it can be selected from at least one of group IV semiconductor nanocrystals, group II-V semiconductor nanocrystals, group II-VI semiconductor nanocrystals, group IV-VI semiconductor nanocrystals, group III-V semiconductor nanocrystalline, or group III-VI semiconductor nanocrystals. For example, it can be at least one of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or gallium nitride quantum dots.

Optionally, the number of layers of the encapsulation layer 13 may be one or plural. Optionally, the material of the first inorganic layer 131 and the second inorganic layer 134 may be selected from at least one of silicon oxide, silicon nitride, silicon oxynitride, aluminum oxide, or magnesium oxide.

The material of the first inorganic layer 131 may also be other metal oxides. Optionally, the material of the getter layer 132 includes getter graphene xs. The getter graphene xs is formed of graphene-based carbon material sm and getter nanoparticle xq through chemical group bonding.

In this embodiment, graphene is used as the material of the getter layer 132. Because graphene has excellent water and oxygen barrier properties, the water and oxygen barrier performance of the getter layer 132 can be improved. In addition, graphene is bonded with getter nanoparticles, which improves the dispersibility of graphene. In the microstructure, a spacer structure of layered graphene and gettering nanoparticles is formed, which can effectively absorb the gas released by the organic layer 133. Secondly, graphene has good ductility and can be used as a stress relief layer to reduce the shrinkage of the organic layer after curing and the damage to the inorganic layer caused by thermal expansion.

Optionally, the chemical group may be an epoxy group, an ether group, or an oxygen-containing group such as an ester group, or a hydrogen-containing group or a fluorine-containing group.

Wherein, the surface of the graphene-based carbon material sm may be connected to at least one getter nanoparticle xq through a chemical group. For example, the surface of the graphene-based carbon material sm can be connected to at least one getter nanoparticle xq through a chemical group.

Figure 2:
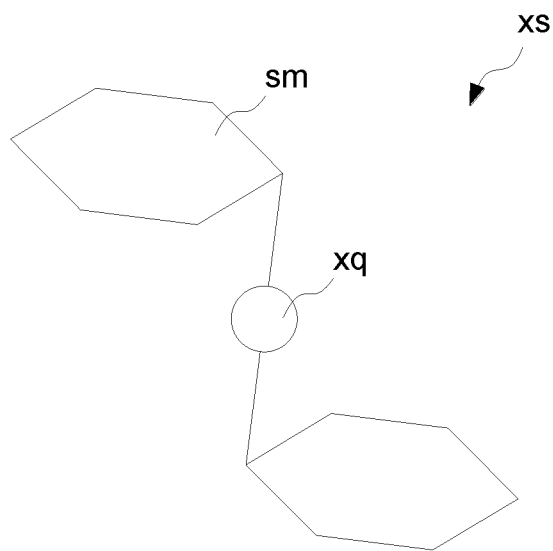
FIG. 2 is a schematic structural diagram of getter graphene in the display panel provided by an embodiment of the present application.

In addition, as shown in FIG. 2, one getter nanoparticle xq can also connect at least one graphene-based carbon material sm particle through a chemical group. For example, a getter nanoparticle xq bonds two graphene particles through two chemical groups.

Graphene-based carbon materials sm can also be bonded together through chemical groups. For example, graphene particles are bonded to carbon nanotube particles through chemical groups, at least two graphene particles are bonded together through chemical groups, or at least two carbon nanotube particles are bonded together through chemical groups.

Optionally, in some embodiments, the graphene-based carbon material sm includes graphene and carbon nanotubes. The graphene particles are bonded to the carbon nanotube particles, and the graphene particles are bonded to the getter nanoparticles xq.

Optionally, the getter nanoparticle xq has a porous structure to improve the gas absorption performance of the getter layer 132. In some embodiments, the getter nanoparticle xq may not be a porous material.

Optionally, the getter nanoparticles xq may be particles such as molecular sieves or nano metal organic framework molecules.

Optionally, the getter layer 132 further includes a resin sz and a photo initiator, that is, the getter graphene xs, resin, and photo initiator are mixed to form the getter layer 132.

Optionally, the resin sz may be epoxy resin or acrylic resin or the like.

Optionally, in some embodiments, a groove is formed on the side of the getter layer 132 facing the organic layer 133, and the organic layer 133 fills the grooves. The formation of grooves on the getter layer 132 improves the flexibility of the getter layer 132 on the one hand, and increases the contact area between the organic layer 133 and the getter layer 132 on the other hand. Furthermore, the efficiency of the getter layer 132 in absorbing the gas released by the organic layer is improved, and the stability of the connection between the getter layer 132 and the organic layer 133 is improved.

Optionally, the viscosity of the material of the getter layer 132 ranges from 100 cps to 500 cps. For example, it can be 100 cps, 200 cps, 300 cps, 400 cps, or 500 cps. The thickness of the getter layer 132 is less than 5 micrometers. For example, it can be 4 micrometers, 3 micrometers, 2 micrometers, or 1 micrometer.

Optionally, the first inorganic layer 131 includes a first boundary 13a. The getter layer 132 includes a second boundary 13b. The organic layer 133 includes a third boundary 13c. The second inorganic layer 134 includes a fourth boundary 13d. The third boundary 13c is defined inside the second boundary 13b. The second boundary 13b is defined inside the first boundary 13a.

The second inorganic layer 134 is connected to the second boundary 13b and the third boundary 13c, respectively. The fourth boundary 13d is located outside the first boundary 13a or coincides with the first boundary 13a. Such an arrangement improves the stability of the encapsulation layer 13 so that the second inorganic layer 134 is connected to the first inorganic layer 131, the getter layer 132, and the organic layer 133.

Optionally, the distance from the first boundary 13a to the second boundary 13b is greater than the distance from the second boundary 13b to the third boundary 13c. This arrangement further improves the stability of the encapsulation layer 13.

Figure 3:
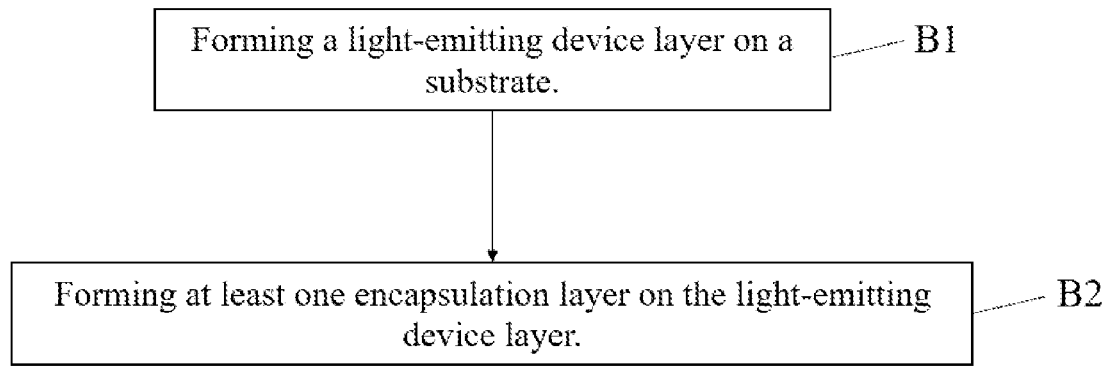
FIG. 3 is a schematic flow chart of a manufacturing method of a display panel provided by an embodiment of the present application.

Please refer to FIG. 3. Correspondingly, the present application further relates to a manufacturing method of the display panel 100, which includes the following steps:

Step B1: forming a light-emitting device layer on a substrate; and

Step B2: forming at least one encapsulation layer on the light-emitting device layer; wherein the step of forming the at least one encapsulation layer on the light-emitting device layer includes following steps:

Step B21: forming a first inorganic layer on the light-emitting device layer;

Step B22: forming a getter layer on the first inorganic layer;

Step B23: forming an organic layer on the gettering layer; and

Step B24: forming a second inorganic layer on the organic layer, wherein the second inorganic layer covers the organic layer and the getter layer and is connected to the first inorganic layer.

In the manufacturing method of the display panel in the embodiment of the present application, a getter layer is formed in the encapsulation layer to absorb the gas released by the organic layer, which reduces the amount of gas in the encapsulation layer, thereby reducing the risk of gas breaking the inorganic layer.

The manufacturing method of the display panel 100 will be described below. It should be noted that the manufacturing method is used to manufacture the display panel 100 of the aforesaid embodiment.

Figure 4:
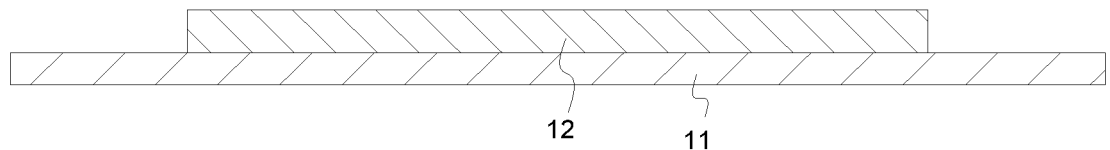
FIG. 4 is a schematic structural diagram of step B1 in the manufacturing method of the display panel provided by an embodiment of the present application.

Please refer to FIG. 4. In step B1, a light-emitting device layer 12 is formed on the substrate 11.

Wherein, substrate 11 includes a base and a thin film transistor disposed on the base. The substrate can be a rigid substrate or a flexible substrate. The material of the substrate includes any one of glass, sapphire, silicon, silicon dioxide, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, polyimide, or polyurethane.

Optionally, the light-emitting device layer 12 includes a first electrode, a light-emitting layer, and a second electrode that are sequentially disposed on the substrate 11. The light-emitting device layer 12 may be a top emission type or a bottom emission type.

That is, one of the first electrode and the second electrode is a reflective electrode, and the other is a transparent electrode.

Optionally, the material of the light-emitting layer may be an organic material. For example, it can be Alq3, bis (2-methyl-8-hydroxyquinoline-N1,O8)-(1,1'-biphenyl-4-hydroxy) aluminum (BAlq), DPVBi, Almq3, 3-tert-butyl-9,10-bis (2-naphthalene)anthracene (TBADN).

The material of the light-emitting layer can also be an inorganic material. For example, it can be selected from at least one of group IV semiconductor nanocrystals, group II-V semiconductor nanocrystals, group II-VI semiconductor nanocrystals, group IV-VI semiconductor nanocrystals, group III-V semiconductor nanocrystalline, or group III-VI semiconductor nanocrystals. For example, it can be at least one of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or gallium nitride quantum dots.

Next, proceed to step B2.

Figure 5:
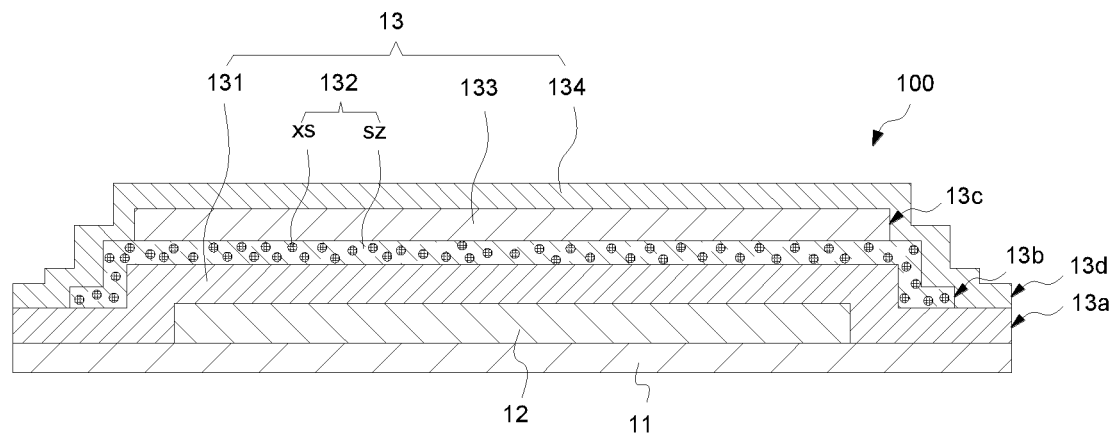
FIG. 5 is a schematic structural diagram of step B2 in the manufacturing method of the display panel provided by an embodiment of the present application.

Please refer to FIG. 5. In step B2, at least one encapsulation layer 13 is formed on the light-emitting device layer 12.

Step B2 includes the following steps:

Step B21: forming a first inorganic layer 131 on the light-emitting device layer 12.

Optionally, the material of the first inorganic layer 131 may be selected from at least one of silicon oxide, silicon nitride, silicon oxynitride, aluminum oxide, or magnesium oxide. The material of the first inorganic layer 131 may also be other metal oxides. Next, proceed to step B22.

Step B22: forming a getter layer 132 on the first inorganic layer 131.

Wherein, step B22 includes the following steps:

Step B221: The graphene-based carbon material sm and the getter nanoparticle xq are bonded through chemical groups to form getter graphene xs.

Optionally, the graphene-based carbon material sm includes at least one of graphene or carbon nanotubes.

Optionally, the chemical group may be an epoxy group, an ether group, or an oxygen-containing group such as an ester group, or a hydrogen-containing group or a fluorine-containing group.

The surface of the graphene-based carbon material sm may be connected to at least one getter nanoparticle xq through a chemical group. For example, the surface of the graphene-based carbon material sm can be connected to at least one getter nanoparticle xq through a chemical group.

In addition, as shown in FIG. 2, one getter nanoparticle xq can also connect at least one graphene-based carbon material sm particle through a chemical group. For example, a getter nanoparticle xq bonds two graphene particles through two chemical groups.

Graphene-based carbon materials sm can also be bonded together through chemical groups. For example, graphene particles are bonded to carbon nanotube particles through chemical groups, at least two graphene particles are bonded together through chemical groups, or at least two carbon nanotube particles are bonded together through chemical groups.

Optionally, in some embodiments, the graphene-based carbon material sm includes graphene and carbon nanotubes. The graphene particles are bonded to the carbon nanotube particles, and the graphene particles are bonded to the getter nanoparticles xq.

Optionally, the getter nanoparticle xq has a porous structure to improve the gas absorption performance of the getter layer 132. In some embodiments, the getter nanoparticle xq may not be a porous material.

Optionally, the getter nanoparticles xq may be particles such as molecular sieves or nano metal organic framework molecules.

Step B222: mixing the getter graphene xs, resin sz, and photo initiator to form a mixed material. The viscosity of the mixed material ranges from 100 cps to 500 cps, for example, it can be 100 cps, 200 cps, 300 cps, 400 cps, or 500 cps.

Step B223: applying the mixed material to the first inorganic layer 131 to form a mixed material layer. The mixed material layer can be formed on the first inorganic layer 131 by spin coating or inkjet printing.

Step B24: curing the mixed material layer to form the gettering layer 132.

The mixed material layer can be cured by ultraviolet light, and the mixed material layer can be baked to form the getter layer 132.

Step B23: forming an organic layer 133 on the gettering layer 132.

Step B24: forming a second inorganic layer 134 on the organic layer 133. The second inorganic layer 134 covers the organic layer 133 and the getter layer 132 and is connected to the first inorganic layer 131.

Optionally, the material of the second inorganic layer 134 may be selected from at least one of silicon oxide, silicon nitride, silicon oxynitride, aluminum oxide, or magnesium oxide. The material of the second inorganic layer 134 may also be other metal oxides.

In this way, the manufacturing process of the display panel 100 of the embodiment of the present application is completed.

In the display panel and the manufacturing method thereof in the embodiments of the present application, the light-emitting device layer is disposed on the substrate, and the encapsulation layer covers the light-emitting device layer and the substrate. The encapsulation layer includes a first inorganic layer, a getter layer, an organic layer, and a second inorganic layer, and the first inorganic layer covers the light-emitting device layer. The getter layer is disposed on the first inorganic layer, the organic layer is disposed on the getter layer, and the second inorganic layer covers the organic layer and the getter layer and is connected to the first inorganic layer.

In the display panel and the manufacturing method thereof in the embodiments of the present application, a getter layer is formed in the encapsulation layer to absorb the gas released by the organic layer, which reduces the amount of gas in the encapsulation layer, thereby reducing the risk of gas breaking the inorganic layer.

In the foregoing, the display panel and the manufacturing method thereof provided by the embodiments of the present application are described in detail. Specific examples are used in this article to illustrate the principles and implementation of the present application. The description of the above examples is only used to help understand the methods and core ideas of the present application. In addition, for those skilled in the art, according to the idea of the application, there will be changes in the specific implementation and the scope of the present application. As described above, the content of this specification should not be construed as limiting the present application.

What is claimed is:

1. A display panel comprising:
   a substrate;
   a light-emitting device layer disposed on the substrate; and
   at least one encapsulation layer, wherein the encapsulation layer comprises:
   a first inorganic layer covering the light-emitting device layer;
   a getter layer disposed on the first inorganic layer;
   an organic layer disposed on the gettering layer; and
   a second inorganic layer covering the organic layer and the getter layer and connected to the first inorganic layer;
   wherein a material of the getter layer comprises getter graphene, the getter graphene is formed of graphene-based carbon material and getter nanoparticles through chemical groups bonding, and the graphene-based carbon materials are bonded to each other through the chemical groups,
   wherein the first inorganic layer comprises a first boundary, the getter layer comprises a second boundary, the organic layer comprises a third boundary, and the second inorganic layer comprises a fourth boundary, wherein the third boundary is defined on an inner side of the second boundary, and the second boundary is defined on an inner side of the first boundary, and the second boundary and the third boundary are connected, and
   wherein a viscosity of the material of the getter layer ranges from 100 cps to 500 cps, a thickness of the getter layer is less than 5 micrometers, and the getter nanoparticles are molecular sieves or nano metal organic framework molecules.

2. The display panel of claim 1, wherein the graphene-based carbon material comprises at least one graphene or carbon nanotube.

3. The display panel of claim 1, wherein the getter layer further comprises a resin and a photo initiator.

4. The display panel of claim 1, wherein each getter nanoparticle has a porous structure.

5. The display panel of claim 1, wherein the second inorganic layer is respectively connected to the second boundary and the third boundary, and the fourth boundary is located outside the first boundary or coincides with the first boundary.

6. The display panel of claim 5, wherein a distance from the first boundary to the second boundary is greater than a distance from the second boundary to the third boundary.

7. The display panel of claim 1, wherein a groove is defined on a side of the gettering layer facing the organic layer, and the organic layer fills the groove.

8. A display panel, comprising:
   a substrate;
   a light-emitting device layer disposed on the substrate; and
   at least one encapsulation layer, wherein the encapsulation layer comprises:
   a first inorganic layer covering the light-emitting device layer;
   a getter layer disposed on the first inorganic layer;
   an organic layer disposed on the gettering layer; and
   a second inorganic layer covering the organic layer and the getter layer and connected to the first inorganic layer,
   wherein the first inorganic layer comprises a first boundary, the getter layer comprises a second boundary, the organic layer comprises a third boundary, and the second inorganic layer comprises a fourth boundary, wherein the third boundary is defined on an inner side of the second boundary, and the second boundary is defined on an inner side of the first boundary, and the second boundary and the third boundary are connected, and
   wherein a viscosity of the material of the getter layer ranges from 100 cps to 500 cps, a thickness of the getter layer is less than 5 micrometers.

9. The display panel of claim 8, wherein a material of the getter layer comprises getter graphene, the getter graphene is formed of graphene-based carbon material and getter nanoparticles through chemical groups bonding.

10. A display panel, comprising:
    a substrate;
    a light-emitting device layer disposed on the substrate; and
    at least one encapsulation layer, wherein the encapsulation layer comprises:
    a first inorganic layer covering the light-emitting device layer;
    a getter layer disposed on the first inorganic layer;
    an organic layer disposed on the gettering layer; and
    a second inorganic layer covering the organic layer and the getter layer and connected to the first inorganic layer,
    wherein a material of the getter layer comprises getter graphene, the getter graphene is formed of graphene-based carbon material and getter nanoparticles through chemical groups bonding,
    wherein the first inorganic layer comprises a first boundary, the getter layer comprises a second boundary, the organic layer comprises a third boundary, and the second inorganic layer comprises a fourth boundary, wherein the third boundary is defined on an inner side of the second boundary, and the second boundary is defined on an inner side of the first boundary, and the second boundary and the third boundary are connected, and
    wherein a viscosity of the material of the getter layer ranges from 100 cps to 500 cps, a thickness of the getter layer is less than 5 micrometers, and the getter nanoparticles are molecular sieves or nano metal organic framework molecules.

11. The display panel of claim 10, wherein the graphene-based carbon material comprises at least one graphene or carbon nanotube.

12. The display panel of claim 10, wherein the getter layer further comprises a resin and a photo initiator.

13. The display panel of claim 10, wherein each getter nanoparticle has a porous structure.

14. The display panel of claim 10, wherein the second inorganic layer is respectively connected to the second boundary and the third boundary, and the fourth boundary is located outside the first boundary or coincides with the first boundary.

15. The display panel of claim 14, wherein a distance from the first boundary to the second boundary is greater than a distance from the second boundary to the third boundary.

* * * * *